United States Patent
Kief et al.

(10) Patent No.: US 9,653,102 B1
(45) Date of Patent: May 16, 2017

(54) DATA READER WITH PINNED FRONT SHIELD

(71) Applicant: Seagate Technology LLC, Cupertino, CA (US)

(72) Inventors: Mark T. Kief, Lakeville, MN (US); Kevin A. McNeill, Derry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/946,813

(22) Filed: Nov. 20, 2015

Related U.S. Application Data (60) Provisional application No. 62/094,426, filed on Dec. 19, 2014.

(51) Int. Cl.
G11B 5/39 (2006.01)
G11B 5/60 (2006.01)

(52) U.S. Cl.
CPC .......... *G11B 5/3912* (2013.01); *G11B 5/3906* (2013.01); *G11B 5/6082* (2013.01)

(58) Field of Classification Search
CPC .......................... G11B 5/3906; G11B 5/3912
USPC ............................ 360/319, 324.11, 324.12
See application file for complete search history.

(56) References Cited

U.S. PATENT DOCUMENTS

| | | | |
|---|---|---|---|
| 7,952,839 B2 * | 5/2011 | Yamazaki .............. | B82Y 25/00 360/324.1 |
| 8,395,867 B2 | 3/2013 | Dimitrov et al. | |
| 8,711,528 B1 * | 4/2014 | Xiao .................... | G11B 5/3909 360/122 |
| 9,001,473 B1 | 4/2015 | Gao et al. | |
| 9,007,729 B1 | 4/2015 | Ho et al. | |
| 9,030,785 B2 * | 5/2015 | Freitag ................. | G11B 5/3143 360/324.11 |
| 9,171,559 B1 | 10/2015 | Nikolaev et al. | |
| 9,177,588 B2 | 11/2015 | Freitag et al. | |
| 9,269,382 B1 * | 2/2016 | Bertero ............... | G11B 5/3929 |
| 9,305,578 B1 * | 4/2016 | Singleton ............. | G11B 5/3932 |
| 9,514,771 B2 * | 12/2016 | Makino ................ | G11B 5/3912 |
| 2004/0207960 A1 * | 10/2004 | Saito .................... | G11B 5/3903 360/324.1 |
| 2005/0270703 A1 * | 12/2005 | Hayakawa ............... | G11B 5/39 360/324.1 |
| 2010/0079917 A1 * | 4/2010 | Miyauchi ............... | B82Y 25/00 360/319 |
| 2010/0188782 A1 * | 7/2010 | Yamazaki .............. | B82Y 10/00 360/294 |
| 2010/0232072 A1 * | 9/2010 | Dimitrov ............... | B82Y 25/00 360/319 |
| 2012/0276415 A1 * | 11/2012 | Sapozhnikov ....... | G01R 33/093 428/831 |
| 2013/0027032 A1 | 1/2013 | Gao et al. | |
| 2014/0104729 A1 * | 4/2014 | Singleton ............. | G11B 5/3912 360/319 |

(Continued)

*Primary Examiner* — Jefferson Evans
(74) *Attorney, Agent, or Firm* — Hall Estill Attorneys at Law (57) ABSTRACT

A data reader may have a magnetoresistive stack consisting of at least magnetically free and magnetically fixed structures. The magnetically fixed structure can be set to a first magnetization direction by a first pinning structure separated from an air bearing surface by a front shield portion of a magnetic shield. The front shield portion may be set to a different second magnetization direction by a second pinning structure.

20 Claims, 6 Drawing Sheets

(56) References Cited

U.S. PATENT DOCUMENTS

| | | | |
|---|---|---|---|
| 2014/0133052 A1* | 5/2014 | Meguro | G11B 5/3906 360/234.3 |
| 2015/0036245 A1* | 2/2015 | Sapozhnikov | G11B 5/11 360/235.4 |
| 2015/0179195 A1 | 6/2015 | Freitag et al. | |
| 2016/0035378 A1* | 2/2016 | Quan | G11B 5/127 428/811.2 |
| 2016/0293188 A1* | 10/2016 | Degawa | G11B 5/3912 |

* cited by examiner

DATA READER WITH PINNED FRONT SHIELD

RELATED APPLICATION

The present application makes a claim of domestic priority under 35 U.S.C. §119(e) to U.S. Provisional Application No. 62/094,426 filed Dec. 19, 2014, the contents of which are incorporated by reference.

SUMMARY

A data reader, in some embodiments, has a magnetoresistive stack set to a first magnetization direction by a first pinning structure separated from an air bearing surface by a front shield portion of a magnetic shield. The front shield portion is set to a different second magnetization direction by a second pinning structure.

DETAILED DESCRIPTION

As data storage systems progress to accommodate increased data generation and transfer, data storage devices are striving for decreased physical size. For example, a data reader may strive for a 10 nm thickness and a 10 nm stripe height that allows for high linear data bit density resolution and greater data capacity. However, decreasing the physical size of data reading components can be magnetically volatile, which can result in degraded signal-to-noise ratio. Hence, there is an industry and consumer interest in configuring a data reader with optimized magnetic and thermal stability at a reduced physical size.

With these issues in mind, a data reader may have a magnetoresistive stack consisting of at least magnetically free and magnetically fixed structures with the magnetically fixed structure set to a first magnetization direction by a first pinning structure that is recessed and separated from an air bearing surface by a front shield portion of a magnetic shield while the front shield portion is set to a second magnetization direction by a second pinning structure. By setting the first and second magnetization directions differently, the front shield portion can be stabilized and the data reader can experience optimized performance. That is, the ability to tune the magnetizations of a front shield portion in a data reader with a recessed first pinning structure provides magnetic properties and repeatability conducive to reduced form factor, high data capacity data storage devices.

Figure 1:
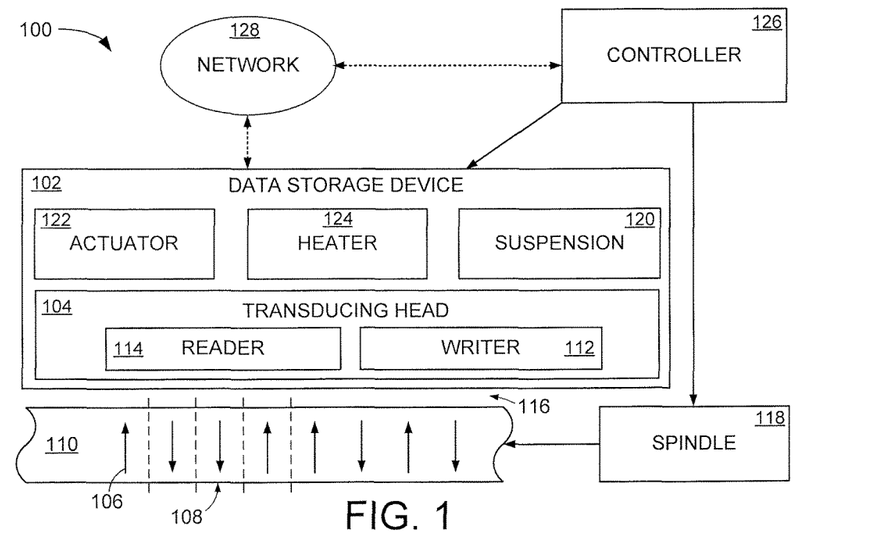
FIG. 1 is a block representation of an example data storage system configured and operated in accordance with some embodiments.

While a data reader employing a recessed pinning structure can be utilized in an unlimited variety of environments and systems, FIG. 1 provides an example data storage system 100 in which a tuned data reader can be commissioned in accordance with some embodiments. Although not required or limiting, the data storage system 100 can have one or more data storage devices 102 that are configured with at least one data storage means. It is contemplated that various solid-state volatile and non-volatile memories can be used in a hybrid data storage device data storage means.

Assorted embodiments arrange at least one data storage means of the data storage system 100 as a hard disk drive with at least one transducing head 104 accessing data bits 106 stored in patterned data tracks 108 on a data storage medium 110. The transducing head 104 can utilize one or more data writers 112 and data readers 114 to store data to and read data from the data storage medium 110. The transducing head 104 may float on an air bearing 116 generated by rotation of the data medium 110 by a spindle motor 118. Any number of components can be connected to the transducing head 104 to control the size of the air bearing 116. For instance, a suspension 120, such as a gimbal, can allow the transducing head 104 to pitch and roll in adaptation to changes induced by an actuator 122 and heater 124.

At least one controller 126 can be connected to the various aspects of the data storage system 100, as shown, to monitor, detect, and control the data storage environment to provide data access operations. A controller 126 can be local or remote, such as through a wired or wireless network 128, and may be utilized individually or collectively with other controlling means, such as processors, servers, hosts, nodes, and application specific integrated circuits (ASICs). With the air bearing 116 and data bit density being configured on a nanometer scale, the data reader 114 can have a small window of time and narrow band of data bit magnetization to sense.

Figure 2:
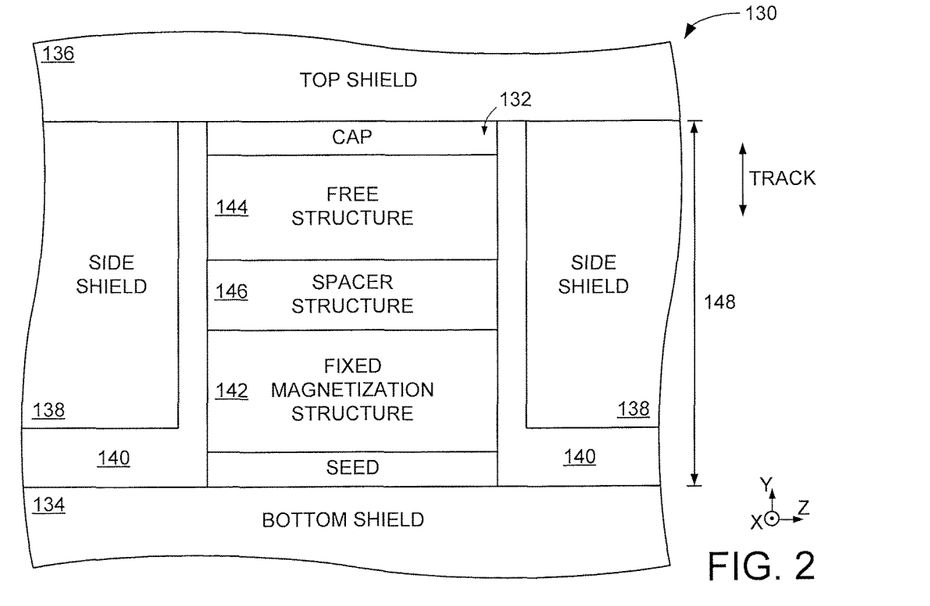
FIG. 2 displays a block representation of a portion of an example data reader capable of being used with the data storage system of FIG. 1.

FIG. 2 displays a block representation of a portion of an example data reader 130 that may be employed in the data storage system 100 of FIG. 1 to sense data on a nanometer scale or less. In accordance with assorted embodiments, the data reader 130 can have at least one magnetoresistive stack 132 disposed between bottom 134 and top 136 shields as well as between side shields 138. It is noted that the terms "bottom" and "top" are not limiting and are meant to denote relative position either down-track or up-track relative to a data track and the motion of the data reader 130.

The magnetoresistive stack 132 can be separated from the side shields 138 by lateral nonmagnetic layers 140 and separated from the bottom 134 and top 136 shields by conductive cap and seed electrode layers, respectively. The magnetoresistive stack 132 may be configured in a variety of different manners to sense data from an adjacent data storage medium. For example, the magnetoresistive stack 132 may be a spin valve, trilayer lamination without a fixed magnetization, or a lateral spin valve with a fixed magnetization structure 142 separated from a magnetically free structure 144 by a spacer structure 146, as shown.

Decreasing the shield-to-shield spacing (SSS) 148 of the data reader 130 can increase data bit linear resolution, but can correspond with increased magnetic and thermal volatility that results in degraded performance. In other words, a small SSS 148 can decrease the physical size of the various layers of the magnetoresistive stack 132, but can also increase the risk of inadvertent magnetic behavior that can jeopardize the accuracy of data bit sensing.

Figure 3:
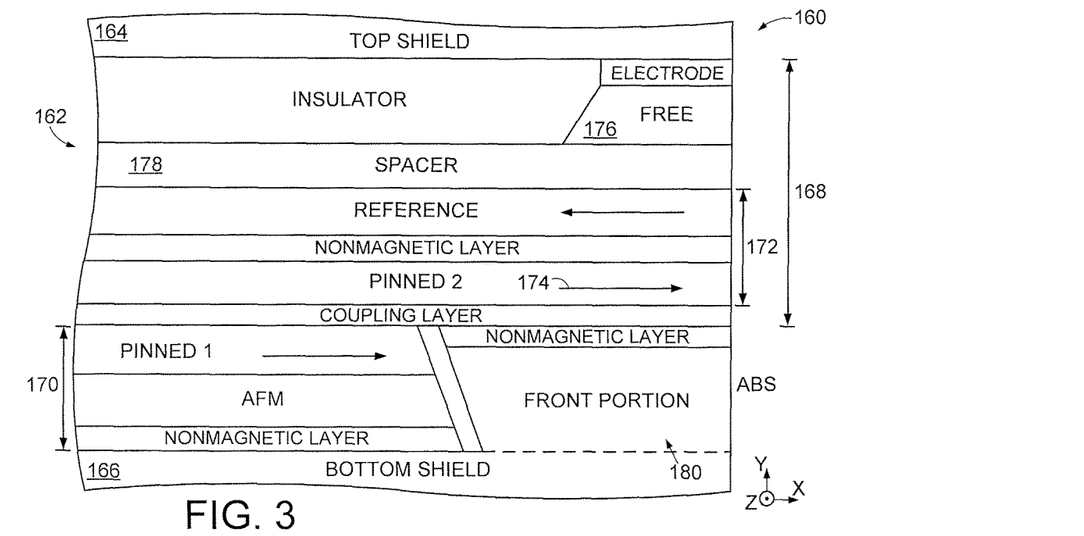
FIG. 3 shows a cross-section view block representation of a portion of an example data reader configured in accordance with some embodiments.

FIG. 3 shows a cross-section view block representation of a portion of an example data reader 160 arranged in accordance with assorted embodiments to increase magnetic performance despite a small SSS. The data reader 160 has a magnetoresistive (MR) stack 162 disposed between top 164 and bottom 166 shields that define the SSS 168. By recessing a fixed magnetization reference pinning structure 170 away from an air bearing surface (ABS), the reference structure 172 of the MR stack 162 can be set to a predetermined magnetization orientation 174 without adding to the SSS 168.

It is noted that the MR stack 162 is configured as a spin valve in FIG. 3 with a magnetically free layer 176 separated from the fixed magnetization reference structure 172 by a non-magnetic spacer layer 178, but such configuration is not required or limiting as lateral spin valve and abutted junction configurations may be utilized. The reference structure 172 is shown as a lamination of magnetic and non-magnetic layers, but various embodiments may configure the reference structure 172 as a single magnetic layer that is set to the predetermined magnetic orientation 174 by the fixed magnetization reference pinning structure 170.

Removal of the fixed magnetization reference pinning structure 170 from the ABS reduces the SSS, but leaves the front portion 180 of the bottom shield 166 vulnerable to unpredictable magnetic volatility. The lateral alignment of the fixed magnetization reference pinning structure 170 and the front portion 180 along the X axis can restrict the physical connection of the front portion 180 with the bottom shield 166, which can result in coupling that is inadequate to control magnetization, such as with the formation of magnetic domain walls. The size, shape, and position of the front portion 180 may also be susceptible to magnetic instabilities in the bottom shield 166. Thus, recessing the fixed magnetization reference pinning structure 170 can decrease SSS 168 at the expense of increased magnetic and thermal volatility.

Figure 4:
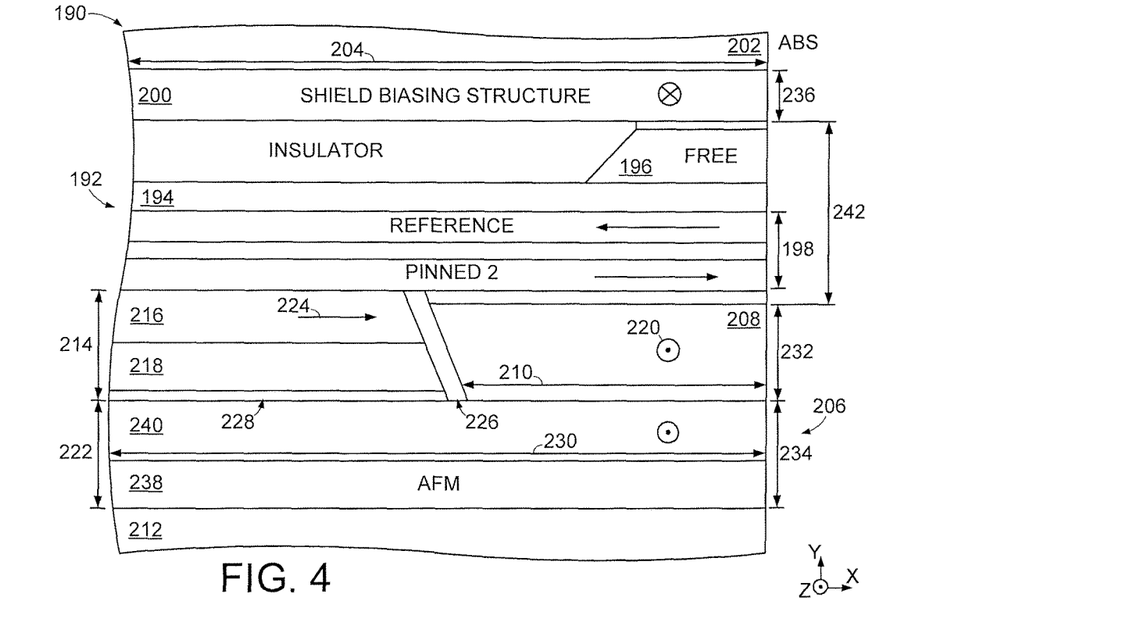
FIG. 4 illustrates a cross-section view block representation of a portion of an example data reader arranged in accordance with various embodiments.

FIG. 4 illustrates a cross-section view block representation of a portion of an example data reader 190 configured to mitigate magnetic and thermal volatility in accordance with some embodiments. An MR stack 192 has a spacer structure 194 disposed between free 196 and reference 198 structures that collectively sense data bits by providing a magnetoresistive ratio. A shield biasing structure 200 is positioned between the MR stack 192 and a top shield 202. The shield biasing structure 200 can be one or more layers of magnetic and non-magnetic materials that can stabilize the magnetization of the top shield 202 with a magnetization oriented orthogonally to the magnetization of the reference structure 198.

In comparison to the contacting length 204 of the shield biasing structure 200 with the top shield 202, the bottom shield 206 has a front shield portion 208 that has a reduced stripe height 210, such as 50 nm as measured from the ABS along the X axis. The reduced stripe height 210 can correspond with magnetic instability from the bottom shield core 212 or from the fixed magnetization of the laterally aligned reference pinning structure 214. That is, the pinned magnetic layer 216 and hard magnetic layer 218 of the reference pinning structure 214, which can be a permanent magnet or antiferromagnet, can induce magnetic and thermal instability in the front shield portion 208 alone and in concert with the magnetization of the bottom shield core 212.

Accordingly, the front shield portion 208 is set to a predetermined magnetization 220 by a shield pinning structure 222 disposed between the bottom shield core 212 and the front shield portion 208. Through tuning the magnetization of the shield pinning structure 222 to induce the predetermined magnetization 220 in the front shield portion 208 that is oriented orthogonally to the magnetization 224 of the reference structure 198 and reference pinning structure 214, the front shield portion 208 can be stabilized without degrading the reference magnetization 224. It is contemplated that the shield pinning structure 222 consists of a single magnetic layer, such as a permanent magnet, multiple magnetic layers, such an exchange coupled magnetic lamination, or multiple magnetic and non-magnetic layers, such as a synthetic antiferromagnet.

In the non-limiting embodiment shown in FIG. 4, the reference pinning structure 214 is separated from the front shield portion 208 by a first nonmagnetic layer 226 and from the shield pinning structure 222 by a second nonmagnetic layer 228. The first 226 and second 228 nonmagnetic layers can be similar or dissimilar materials that allow the reference pinning structure 214 to maintain the predetermined magnetization 224 without influence from the shield pinning structure 222. It is noted that the shield pinning structure 222 continuously extends from the ABS to a stripe height 230 that is greater than the front shield portion 208 and the free structure 196 of the MR stack 192, but such configuration is not required as the stripe height 230 can be tuned in relation to the size of the front shield portion 208 and free structure 196 to provide optimized data sensing performance.

While the front shield portion 208 can be tuned for thickness 232 along the Y axis, such as 10 nm, that can match the thickness of the reference pinning structure 222, the thickness 234 of the shield pinning structure 222 may be similar or dissimilar to the thickness 236 of the shield biasing structure 200. In various embodiments, the shield biasing structure 200 has a matching configuration with the shield pinning structure 222 with a hard magnetic layer 238 contacting a magnetic layer 240 in either an exchange coupled lamination or a synthetic antiferromagnet. Other embodiments can configure the shield biasing structure 200 with different materials and layers than the shield pinning structure 222. The ability to tune the respective fixed magnetization shield biasing 200 and pinning 222 structures allows the shields 202, 208, and 212 to be stabilized with a reduced SSS 242 compared to a reader having the reference pinning structure 214 positioned on the ABS.

Figure 5:
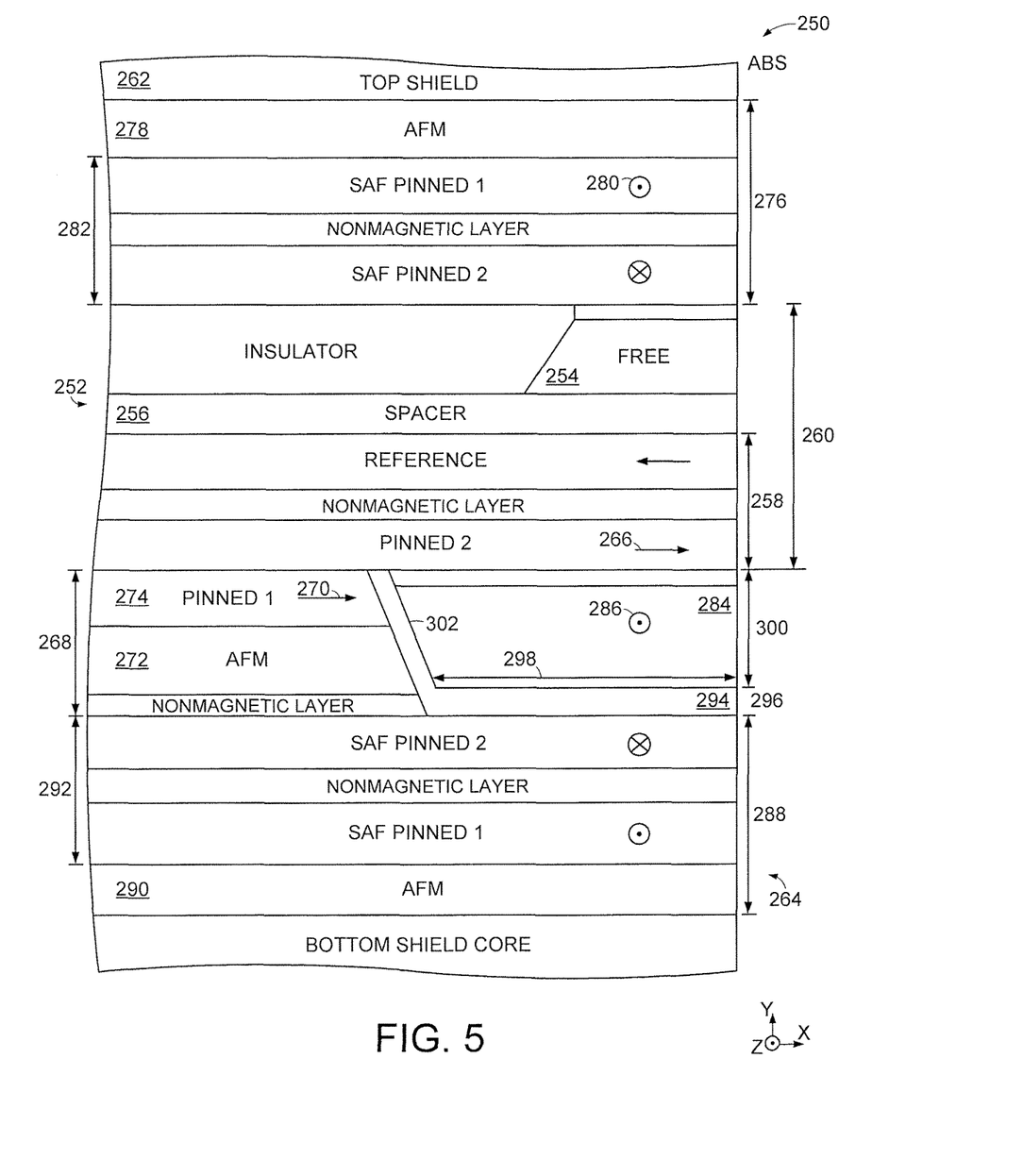
FIG. 5 depicts a cross-section view block representation of a portion of an example data reader configured in accordance with some embodiments.

FIG. 5 is a cross-section view block representation of a portion of an example data reader 250 arranged in accordance with some embodiments. The data reader 250 has an MR stack 252 with free 254, spacer 256, and reference 258 structures each positioned on the ABS with a SSS 260 between top 262 and bottom 264 shields. As shown, the reference structure 258 is a lamination of magnetic and non-magnetic layers that provide a reference magnetization 266 set by a reference pinning structure 268 recessed from the ABS. The reference pinning structure 268 has a pinning magnetization 270 set by an antiferromagnet layer 272 and transferred to the reference structure 258 by a magnetic layer 274.

The top shield 262 is stabilized by a biasing structure 276 consisting of an antiferromagnet layer 278 setting a biasing magnetization 280 in a synthetic antiferromagnet portion 282. The bottom shield 264 has a front shield portion 284 set to a stabilizing magnetization 286 by a shield pinning structure 288 that has an antiferromagnet layer 290 contacting a synthetic antiferromagnet portion 292. The stabilizing magnetization 286 and biasing magnetization 280 are shown to be aligned along the Z axis and respectively orthogonal to the pinning 270 and reference 266 magnetizations experienced by the MR stack 252, but such magnetization configuration is not required or limiting. The ability to tune the magnetization strengths and orientations of at least the front shield portion 284, reference pinning structure 268, and reference structure 258 allows the data reader 250 to operate with minimal magnetic and thermal instability.

An interlayer 294 may be configured to continuously extend from the ABS between the front shield portion 284 and shield pinning structure 288 as well as between the front shield portion 284 and the reference pinning structure 268. The interlayer 294 may be constructed of a coupling material, such as a transition metal material like Ru, that aids in the maintenance of the orthogonal relationship of the stabilizing 286 and pinning 270 magnetizations. The interlayer thickness 296 can be uniform or varying throughout the layer's stripe height from the ABS to decouple the reference pinning structure 268 with the front shield portion 284.

As such, the front shield portion 284 can be concurrently coupled to the shield pinning structure 288 while maintaining the stabilizing magnetization 286 in an orthogonal relationship with the pinning 270 magnetization. The orthogonal orientation of the magnetizations 270 and 286 may be controlled by tuning the stripe height 298 of the front shield portion 284 compared to the thickness 300 of the front shield portion 284 and the angle of the rear surface 302 of the front shield portion 284 in relation to the ABS. It is contemplated that various processing means, such as oblique incidence sputtering, may also control the orientations of the respective magnetizations 270 and 286 through uniaxial anisotropy manipulation.

Figure 6A:
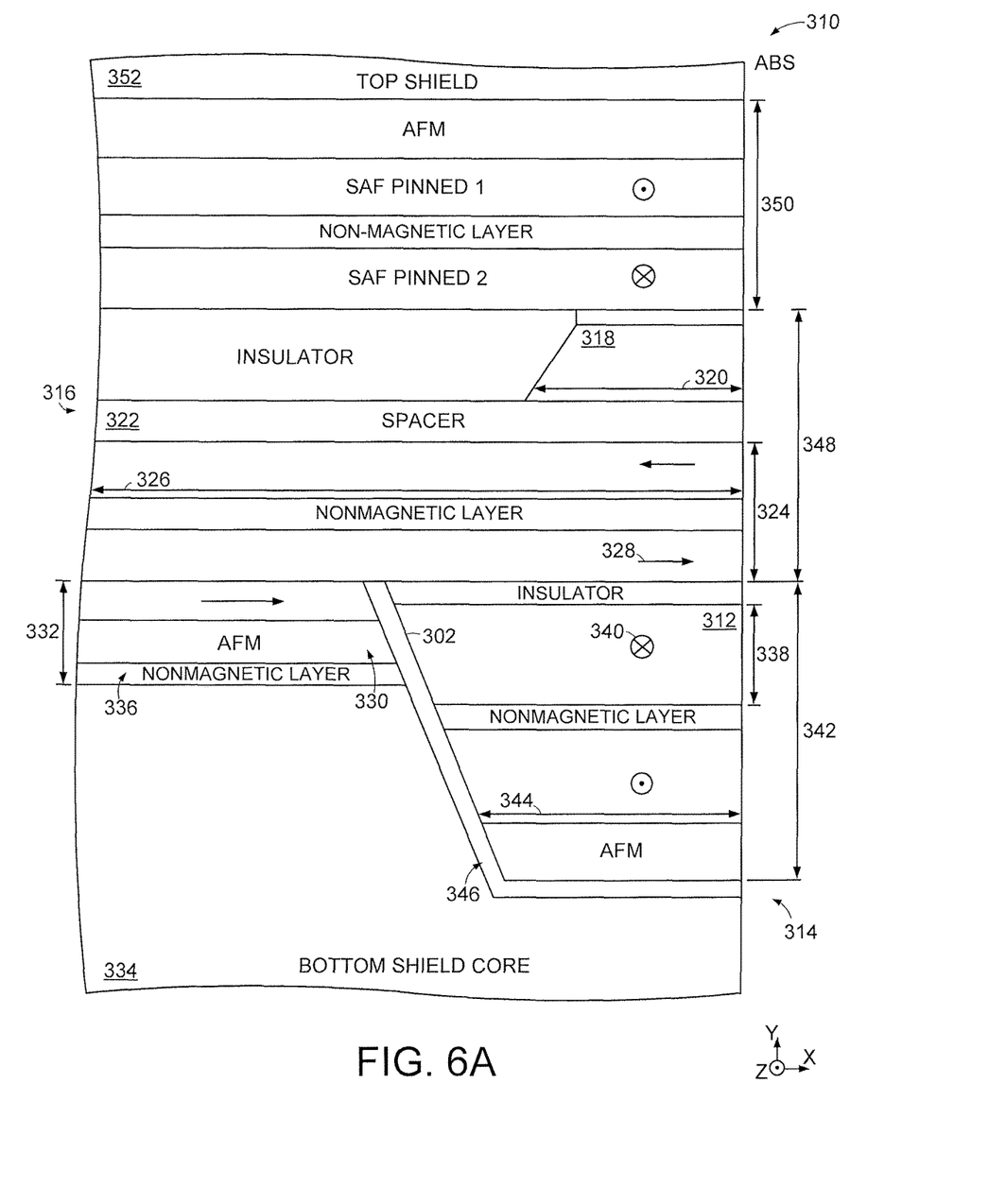
FIGS. 6A-6C respectively provide assorted views of portions of an example data reader arranged in accordance with assorted embodiments.
Figure 6B:
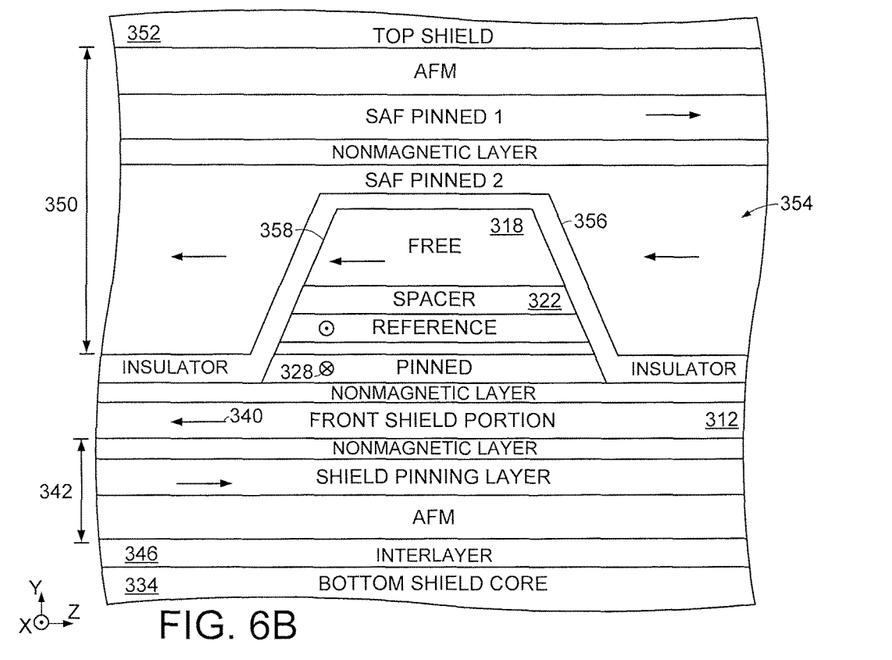
Figure 6C:
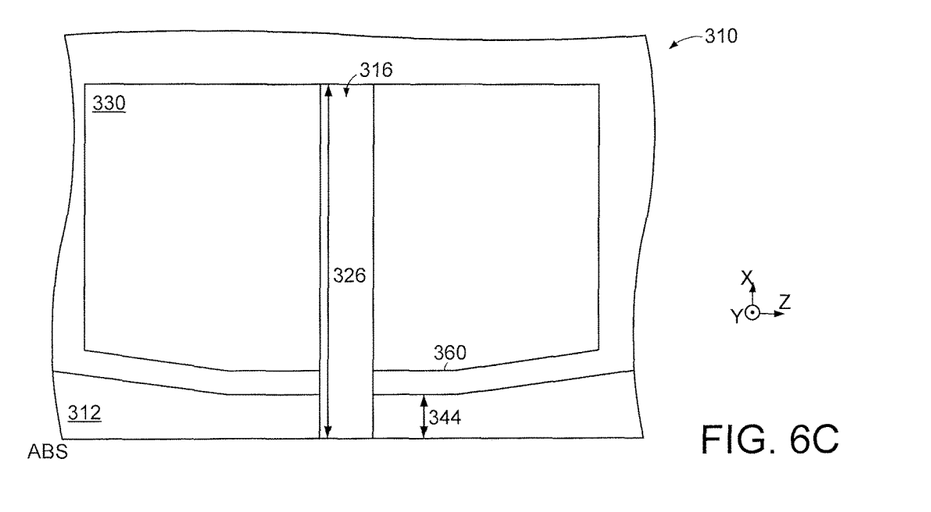

FIGS. 6A, 6B, and 6C respectively display block representations of various views of portions of an example data reader 310 configured in accordance with some embodiments to provide more robust magnetic stability in a front shield portion 312 of a bottom shield 314. As illustrated in FIG. 6A, the data reader 310 has an MR stack 316 consisting of a free layer 318 having a short stripe height 320 while spacer 322 and reference 324 structures each have a long stripe height 326. The reference structure 324 is a synthetic antiferromagnet that is pinned to a reference magnetization 328 by a reference pinning lamination 330.

The reference pinning lamination 330 has a thickness 332 along the Y axis and is separated from the ABS by the front shield portion 312 and from the bottom shield core 334 by an nonmagnetic layer 336. The front shield portion 312 has a thickness 338 that can be greater than thickness 332. The front shield portion 312 is pinned to a front magnetization 340 by a shield pinning structure 342. In comparison with the shield pinning structures 222 and 286 of FIGS. 4 and 5, the shield pinning structure 342 has a varying stripe height 344 from the ABS that contacts at least one nonmagnetic layer 346 to respectively decouple the bottom shield core 334 and reference pinning lamination 330 from the front shield portion 312.

Although not limiting, the shield pinning structure 342 can be a single antiferromagnetic material (AFM), such as IrMn, or a lamination of magnetic and non-magnetic materials in the form of a synthetic antiferromagnet (SAF). For example, a SAF shield pinning structure 342 may be configured as successive layers of a seed, IrMn, NiFe, Ru, and NiFe, in some embodiments, while other embodiments configure the structure 342 as successive layers of seed, IrMn, coFe, NiFe, CoFe, Ru, CoFe, NiFe, CoFe materials. The ability to tune the shield pinning structure 342 through the selection of magnetic materials, like NiFe and CoFe, and transition metal interlayers, such as Ru, can provide magnetic characteristics conducive to high linear data bit density data storage devices.

With the ability to tune the size of the shield pinning structure 342 by adjusting at least the stripe height 344, the coupling strength and susceptibility of the front magnetization 340 to the reference pinning lamination 330 and the bottom shield core 334 can be controlled. In other words, the tuned configuration of the shield pinning structure 342 can promote, eliminate, and otherwise control the coupling of the front shield portion 312 with the bottom shield core 334 and reference pinning lamination 330. The capability of constructing the shield pinning structure 342 of a single AFM layer or as a SAF further tunes the strength, volatility, and orientation of the front magnetization 340. The relationship of the front magnetization 340 with the reference magnetization 328, such as, but not limited to, the orthogonal relationship shown in FIG. 6, allows the magnetic stability and performance of the data reader 310 to be optimized despite a shortened SSS 348 provided by recessing the reference pinning lamination 330 from the ABS.

FIG. 6B illustrates an ABS view of the data reader 310 where a shield biasing structure 350 is disposed between the MR stack 316 and the top shield 352. The shield biasing structure 350 is configured as a SAF and has protrusions 354 that extend on opposite lateral sides of the MR stack 316 as side shields with sidewalls 356 shaped to match the MR stack sidewalls 358. The shield biasing structure 350 is completely separated from the front shield portion 312 by one or more nonmagnetic layers.

In the top view of FIG. 6C, the tuned shape of the front shield portion 312 with varying stripe heights 344 from the ABS along the Z-X plane can correspond with a shaped front surface 360 of the reference pinning lamination 330. It can be appreciated that the long stripe height 326 of the MR stack 316 can be configured as the aggregate of the stripe heights of the front shield portion 312, reference pinning lamination 330, and nonmagnetic layer 346. The various views of FIGS. 6A-6C show how the magnetizations of the free layer 318, shield biasing structure 350, front shield portion 312, and shielding pinning structure 342 can be parallel and each orthogonal to the magnetization of the reference structure 324 and reference pinning lamination 330.

Figure 7:
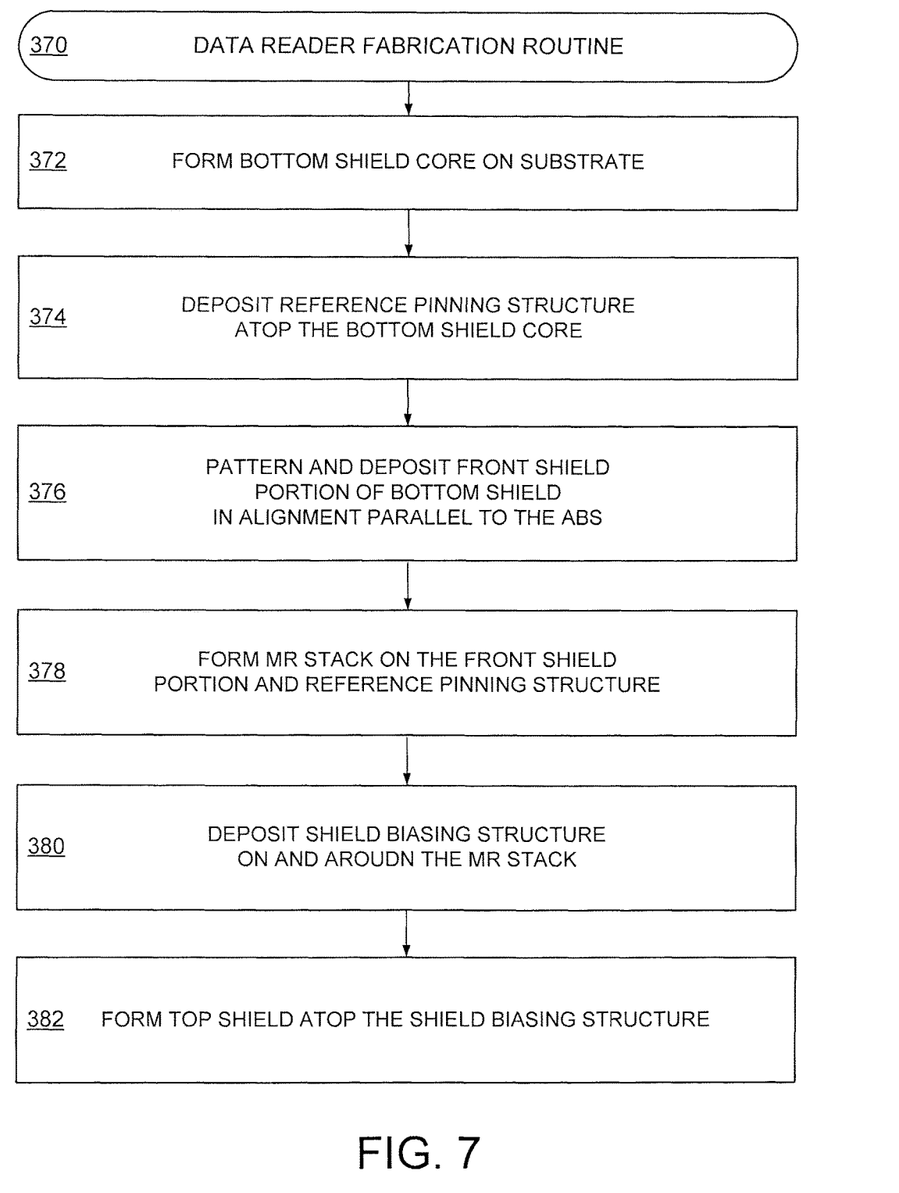
FIG. 7 plots an example data reader fabrication routine carried out in accordance with various embodiments.

FIG. 7 provides a flowchart of an example data reader fabrication routine 370 that may be carried out in accordance with some embodiments. Initially, the routine 360 can form a bottom shield core on a substrate in step 372. The underlying substrate may be any material, such as AlTiC, glass, or MgO, with any amount of texture to allow a magnetic shield material, such as CoFe or NiFe, to be formed with a predetermined thickness as measured parallel to the ABS and along the Y axis of FIGS. 3-6. Step 374 proceeds to deposit a stack pinning structure atop the bottom shield core. Step 374 may provide AFM or SAF magnetic structures that have uniform or varying stripe heights from the ABS.

It is contemplated that step 374 first removes portions of the bottom shield core before depositing the shield pinning structure, such as in the data reader configuration shown in FIG. 6A. A front shield portion is then deposited on the shield pinning structure in step 376 before a reference pinning structure is formed as an AFM or SAF structure in lateral alignment with the front shield portion. Step 378 next forms an MR stack of magnetic and non-magnetic layers prior to a shield biasing structure, such as an AFM or SAF structure, is deposited on the MR stack in step 380. Finally, a top shield is formed in step 382.

It is noted that the various steps of routine 370 are not required or limiting. As such, any step or decision can be inserted, removed, or modified from that shown in FIG. 7. For example, a step or decision may be inserted that evaluates and installs an transition metal material interlayer between the shield pinning structure, the front shield portion, and the reference pinning structure. As another non-limiting example, the shield biasing structure can be configured with protrusions that are laterally aligned with at least the free layer of the MR stack to serve as side shields.

Through the various tuned configurations of shield pinning and reference pinning structures, a front shield portion of a bottom shield can be stabilized with a front magnetization. By tuning the size, shape, and construction of the pinning structures, the front shield magnetization can be oriented orthogonally to the reference magnetization of the MR stack, which can optimize data bit sensing. The ability to tune the materials, thicknesses, configurations, and magnetizations of the pinning structures can allow the recessed reference pinning structure arrangement to be customized for us in standard spin valve, lateral spin valve, multiple read sensors, and two-dimensional magnetic reading environments.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetoresistive stack set to a first magnetization direction by a pinning structure separated from an air bearing surface (ABS) by a front shield portion of a magnetic shield, the front shield portion set to a second magnetization direction differing from the first magnetization direction by a stabilizing structure of the magnetic shield, the front shield portion separated from the magnetoresistive stack by a non-magnetic layer and a coupling layer.

2. The apparatus of claim 1, wherein the magnetoresistive stack comprises a magnetically free structure and a magnetically fixed structure.

3. The apparatus of claim 2, wherein the front shield is positioned proximal the magnetically fixed structure on the ABS and distal the magnetically free structure on the ABS.

4. The apparatus of claim 1, wherein the first magnetization direction is perpendicular to the ABS and the second magnetic direction is parallel to the ABS.

5. The apparatus of claim 1, wherein the non-magnetic layer has a shorter stripe height from the ABS than the magnetic coupling layer.

6. The apparatus of claim 5, wherein the magnetic coupling layer continuously extends from the ABS to separate the pinning structure from the magnetoresistive stack.

7. The apparatus of claim 1, wherein the pinning structure comprises a pinning layer contacting a pinned layer.

8. The apparatus of claim 1, wherein the front shield portion comprises a single layer of magnetic material.

9. The apparatus of claim 1, wherein the pinning structure is separated from the stabilizing structure by a non-magnetic layer.

10. The apparatus of claim 1, wherein the magnetoresistive stack and stabilizing structure each having greater stripe heights than the front shield portion or pinning structure, the respective stripe heights each measured perpendicular to the ABS.

11. An apparatus comprising a magnetoresistive stack set to a first magnetization direction by a pinning structure separated from an air bearing surface (ABS) by a front shield portion of a magnetic shield, the front shield portion set to a second magnetization direction differing from the first magnetization direction by a stabilizing structure of the magnetic shield, a magnetically free portion of the magnetoresistive stack having a smaller stripe height than the front shield portion, each stripe height measured perpendicular to the ABS.

12. The apparatus of claim 11, wherein the front shield portion forms a synthetic antiferromagnet (SAF) with the stabilizing structure.

13. The apparatus of claim 11, wherein the front shield portion is separated from the pinning structure and from the magnetic shield by a non-magnetic layer.

14. The apparatus of claim 13, wherein the non-magnetic layer continuously extends from the ABS around the front shield portion in contact with first and second front shield portion surfaces, the first front shield portion surface extending from the ABS perpendicular to the ABS, the second front shield portion oriented at a non-zero angle with respect to the ABS.

15. An apparatus comprising a magnetoresistive stack disposed between first and second magnetic shields on an air bearing surface (ABS), the magnetoresistive stack set to a first magnetization direction by a pinning structure separated from the ABS by a front shield portion of the first magnetic shield, the front shield portion set to a second magnetization direction differing from the first magnetization direction by a stabilizing structure of the first magnetic shield, the first shield, second shield, and pinning structure each having widths that are greater than a stack width of the magnetoresistive stack, each width measured parallel to the ABS.

16. The apparatus of claim 15, wherein the pinning structure has a width that is greater than the magnetoresistive stack and less than the front shield portion, each width measured parallel to the ABS.

17. The apparatus of claim 15, wherein the second magnetic shield continuously extends around orthogonal sides of the magnetoresistive stack.

18. The apparatus of claim 15, wherein each magnetic shield comprises a synthetic antiferromagnet (SAF) and a magnetic core layer.

19. The apparatus of claim 15, wherein each SAF, the front shield portion, and a magnetically free layer of the magnetoresistive stack have magnetizations oriented along an axis parallel to the ABS.

20. The apparatus of claim 15, wherein the first magnetic shield is separated from the second magnetic shield by a single continuous insulating layer.

* * * * *